United States Patent
Hsu

(10) Patent No.: US 10,566,509 B2
(45) Date of Patent: Feb. 18, 2020

(54) LIGHT EMITTING STRUCTURE

(71) Applicant: EPISTAR CORPORATION, Hsinchu (TW)

(72) Inventor: Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/688,339

(22) Filed: Aug. 28, 2017

(65) Prior Publication Data

US 2017/0358721 A1 Dec. 14, 2017

Related U.S. Application Data

(63) Continuation of application No. 15/285,678, filed on Oct. 5, 2016, now Pat. No. 9,748,456, which is a (Continued)

(30) Foreign Application Priority Data

Sep. 8, 2010 (TW) ................ 99130428 A

(51) Int. Cl.
*H01L 33/60* (2010.01)
*H01L 33/48* (2010.01)
(Continued)

(52) U.S. Cl.
CPC .............. *H01L 33/60* (2013.01); *H01L 33/38* (2013.01); *H01L 33/486* (2013.01);
(Continued)

(58) Field of Classification Search
CPC .......... H01L 33/60; H01L 33/38; H01L 33/54; H01L 33/58
See application file for complete search history.

(56) References Cited

U.S. PATENT DOCUMENTS

| 5,696,389 A * | 12/1997 | Ishikawa ................ B82Y 20/00 |
| | | 257/773 |
| 6,858,880 B2 * | 2/2005 | Horiuchi ................ H01L 33/486 |
| | | 257/100 |

(Continued)

FOREIGN PATENT DOCUMENTS

| CN | 1424774 A1 | 6/2003 |
| CN | 1564331 A | 1/2005 |

(Continued)

*Primary Examiner* — Tucker J Wright
(74) *Attorney, Agent, or Firm* — Ditthavong & Steiner, P.C.

(57) ABSTRACT

A light-emitting structure includes a semiconductor light-emitting element, a first connection point and a reflective element. The semiconductor light-emitting element includes a bottom surface, a top surface opposite to the bottom surface, and a side surface arranged between the bottom surface and the top surface. The first connection point is arranged on the bottom surface. The reflective element includes a first portion arranged right beneath the bottom surface, and a second portion not overlapping the bottom surface and uplifted from a lower elevation lower than the bottom surface to a higher elevation substantially equal to that of the top surface along a curved path.

18 Claims, 11 Drawing Sheets

Related U.S. Application Data continuation of application No. 14/536,169, filed on Nov. 7, 2014, now Pat. No. 9,484,498, which is a continuation of application No. 13/227,841, filed on Sep. 8, 2011, now Pat. No. 8,936,970.

(51) Int. Cl.

| | | |
|---|---|---|
| *H01L 33/54* | (2010.01) | |
| *H01L 33/62* | (2010.01) | |
| *H01L 33/38* | (2010.01) | |
| *H01L 33/50* | (2010.01) | |
| *H01L 33/58* | (2010.01) | |
| *H01L 33/00* | (2010.01) | |

(52) U.S. Cl.
CPC ............ *H01L 33/507* (2013.01); *H01L 33/54* (2013.01); *H01L 33/58* (2013.01); *H01L 33/62* (2013.01); *H01L 33/0079* (2013.01); *H01L 2224/16* (2013.01); *H01L 2933/0033* (2013.01); *H01L 2933/0066* (2013.01)

(56) References Cited

U.S. PATENT DOCUMENTS

| | | |
|---|---|---|
| 6,933,535 B2 | 8/2005 | Steigerwald et al. |
| 7,482,696 B2 | 1/2009 | Shei et al. |
| 8,357,552 B2 | 1/2013 | Kao |
| 2004/0046242 A1 | 3/2004 | Asakawa |
| 2005/0104080 A1* | 5/2005 | Ichihara .................. H01L 33/32 257/98 |
| 2005/0116324 A1 | 6/2005 | Yamaguchi |
| 2006/0006404 A1 | 1/2006 | Ibbetson et al. |
| 2006/0138436 A1 | 6/2006 | Chen et al. |
| 2007/0030675 A1* | 2/2007 | Oon ........................ G03B 15/05 362/237 |
| 2007/0252133 A1 | 11/2007 | Chang |
| 2011/0121335 A1* | 5/2011 | Takakusaki ............. H01L 33/60 257/98 |

FOREIGN PATENT DOCUMENTS

| | | |
|---|---|---|
| CN | 1674314 A | 9/2005 |
| CN | 1825637 A | 8/2006 |
| CN | 101103499 A | 1/2008 |
| CN | 101814487 A | 8/2010 |
| TW | 200701493 A | 1/2007 |

\* cited by examiner

LIGHT EMITTING STRUCTURE

CROSS-REFERENCE TO RELATED APPLICATIONS

This application is a continuation application of Ser. No. 15/285,678, filed on Oct. 5, 2016, which is a continuation application of Ser. No. 14/536,169, filed on Nov. 7, 2014, now U.S. Pat. No. 9,484,498, which is a continuation application of Ser. No. 13/227,841, filed on Sep. 8, 2011, now U.S. Pat. No. 8,936,970 and claims the right of priority based on Taiwan patent application Ser. No. 099130428, filed on Sep. 8, 2010, and the content of which is hereby incorporated by reference in its entirety.

TECHNICAL FIELD

The present application relates to a light-emitting structure and a method of making the same. The light-emitting structure includes a semiconductor light-emitting element and electrodes. To improve a light extraction efficiency of the light-emitting element, the electrodes can form a concave which reflects the light emitted by the semiconductor light-emitting element.

DESCRIPTION OF BACKGROUND ART

In a commonly-known process of making a light-emitting structure, a chip of a light-emitting element such as a light-emitting diode (LED) is made by dicing a finished epitaxial structure formed by an epitaxial growth process. The chip is then arranged on a submount, which is a lead frame or a big size mounting substrate, for the following wire-bonding, soldering, phosphor-coating, and encapsulation processes. However, there are too many steps in these processes. Consequently, the time and the cost of the manufacture are dramatically increased.

SUMMARY OF THE DISCLOSURE

The application discloses a light-emitting structure which includes a semiconductor light-emitting element, a first connection point and a reflective element. The semiconductor light-emitting element includes a bottom surface, a top surface opposite to the bottom surface, and a side surface arranged between the bottom surface and the top surface. The first connection point is arranged on the bottom surface. The reflective element includes a first portion arranged right beneath the bottom surface, and a second portion not overlapping the bottom surface and uplifted from a lower elevation lower than the bottom surface to a higher elevation substantially equal to that of the top surface along a curved path.

DESCRIPTIONS OF EMBODIMENTS

The application discloses a light-emitting structure and a method of making the light-emitting structure.

Embodiment 1

Figure 1A:
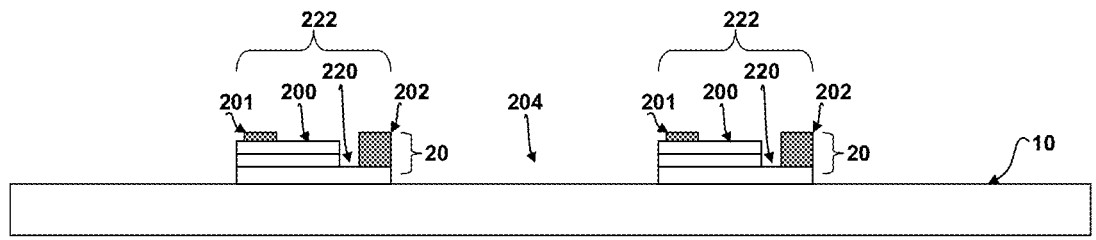
FIGS. 1A~1H illustrate a manufacturing process in accordance with the first embodiment of the present application.

FIGS. 1A~1H are schematic diagrams showing the structures in accordance with one embodiment of the present application. As shown in FIG. 1A, a carrier 10, on which several semiconductor light-emitting element 20 are arranged, is provided. There is a gap 204 between the semiconductor light-emitting elements 20. The semiconductor light-emitting elements 20 can emit lights having identical or different wavelength(s) ranged between ultraviolet and infrared. The semiconductor light-emitting element 20 can be a light-emitting diode having an upper surface 200, on which a first connection point 201 is arranged, and a down surface 220 on which a second connection point 202 is arranged, wherein the upper surface and the down surface are on the same side 222 of the light-emitting element 20. The semiconductor light-emitting element 20 can emit light when the current is injected through the first and the second connection points. The carrier 10 can be a growth substrate, such as sapphire, SiC, ZnO, GaN, AlN, or GaAs, for growing the semiconductor light-emitting element 20. The semiconductor light-emitting elements 20 can be formed on the carrier 10 by a conventional semiconductor growth technology.

Figure 1B:
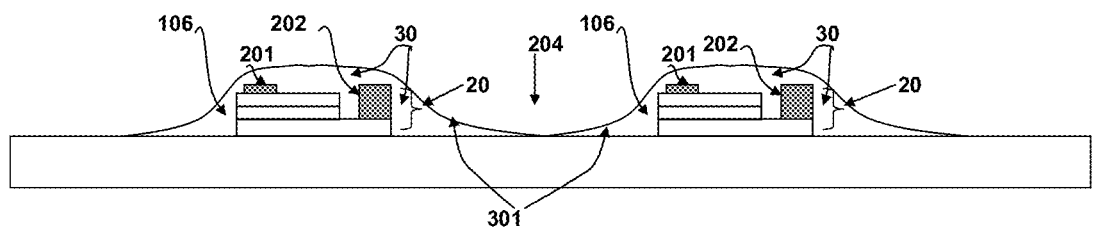

Then, as shown in FIG. 1B, a glue layer 30 is formed on the gap 204 wherein the glue layer 30 is mainly formed on the side wall 106 of the semiconductor light-emitting element 20 to form a surface 301. The glue layer 30 can be formed by spin coating, printing, or molding glue filling, and the material of the glue layer 30 can be elastic material such as silicone rubber, silicon resin, silicone gel, elastic PU, porous PU, or acrylic rubber; or dies-cutting glue such as blue film and UV glue. During the process of forming the glue layer 30, some glue layer 30 may cover the first connection point 201 and the second connection point 202 of the semiconductor light-emitting element 20. In that case, the first connection point 201 and the second connection point 202 of the semiconductor light-emitting elements 20 can be exposed by polishing process to remove the glue layer 30 as shown in FIG. 1C.

Figure 1C:
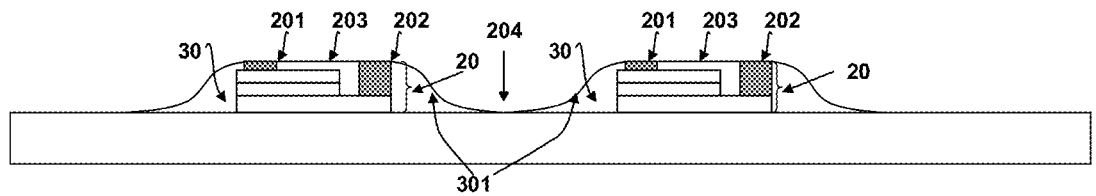
Figure 1D:
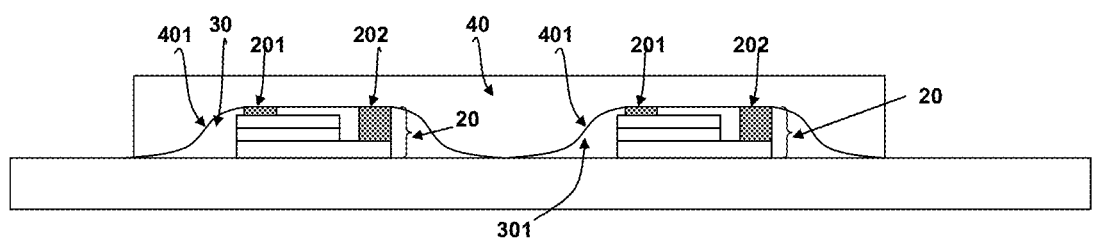

Next, as shown in FIG. 1D, a metal layer 40 is formed on the glue layer 30 and the semiconductor light-emitting elements 20. The metal layer 40 can be formed by plating, evaporation, or sputtering, and can be the material with conductivity and high reflectivity, such as copper (Cu), aluminum (Al), gold (Au), silver (Ag) or other alloys. Since the formation of the metal layer 40 follows the topography of the below structure, the metal layer 40 contacting with the glue layer 30 forms a corresponding surface 401 along the surface 301 of the glue layer 30, and contacts with the first connection point 201 and the second connection point 202 of the semiconductor light-emitting element 20, wherein the corresponding surface 401 can be a curved surface, a beveled surface, or the combination of a partial curved surface and a partial beveled surface.

Figure 1E:
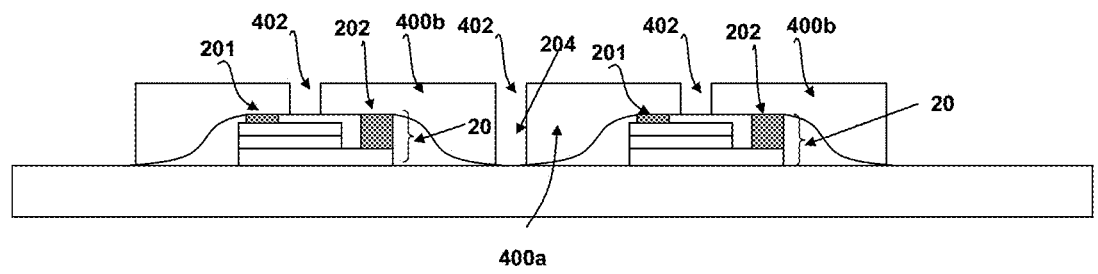

Then, as shown in FIG. 1E, the metal layer 40 can be patterned to form a plurality of grooves 402 by photolithography and etching, wherein the grooves 402 on the semiconductor light-emitting element 20 can divide the metal layer 40 on the semiconductor light-emitting element 20 into a first electrode 400a and a second electrode 400b. The first electrode 400a is electrically connected to the first connection point 201, and the second electrode 400b is electrically connected to the second connection point 202. The groove 402 upon the gap 204 can electrically isolate the two adjacent semiconductor light-emitting elements 20.

In another embodiment, after the polishing process as shown in FIG. 1C, the first electrode 400a and the second electrode 400b can also be formed by the process of forming a patterned photoresist to cover the gap 204 and the second surface 203 between the first connection point 201 and the second connection point 202, and then electroplating metal material on the surface 301, the first connection point 201 and the second connection point 202, and then removing the patterned photoresist.

Figure 1F:
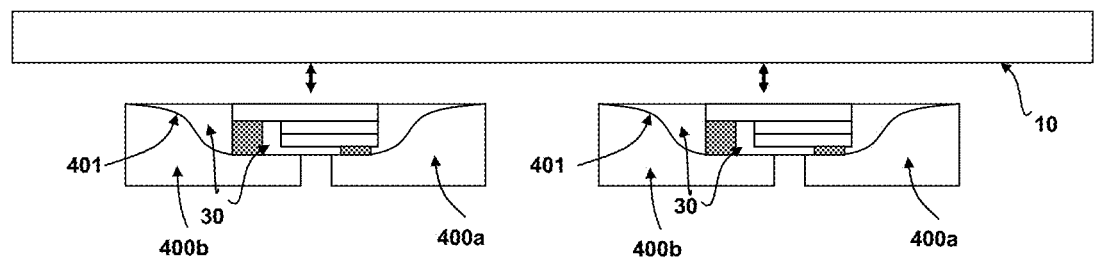
Figure 1G:
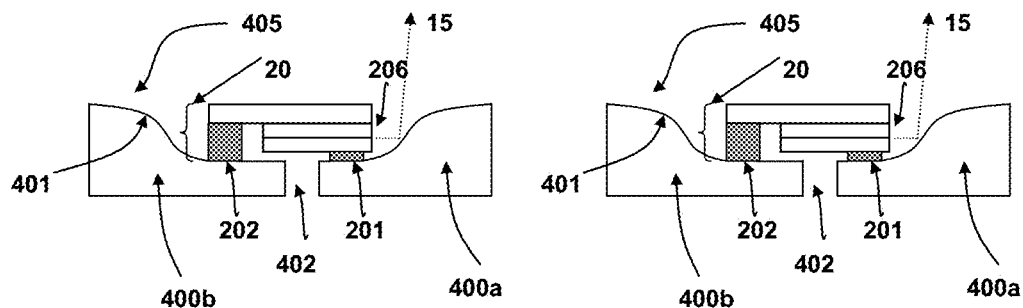
Figure 1H:
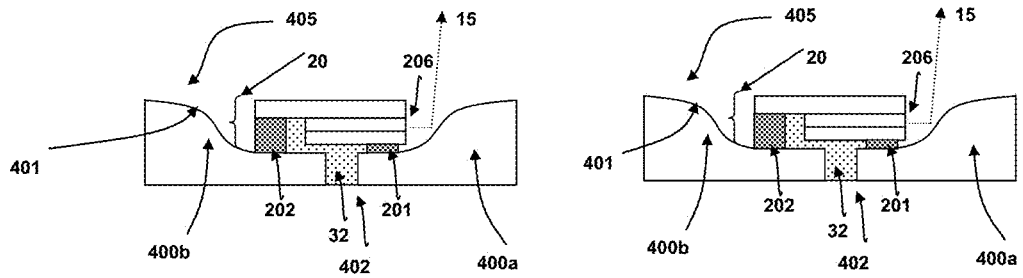

Then, as shown in FIG. 1F, the carrier 10 can be removed by laser lift-off, etching, or other methods. Finally, the glue layer 30 is removed as shown in FIG. 1G to exposes the corresponding surface 401 of the first electrode 400a and the second electrode 400b. A plurality of light-emitting structures 50 is formed accordingly. It should be noted that since the first electrode 400a and the second electrode 400b of the light-emitting structure 50 are conductive, the external current is injected into the semiconductor light-emitting element 20 through the first connection point 201 and the second connection point 202 to generate light. Therefore, there is no need to connect wires to the first connection point 201 and the second connection point 202 of the semiconductor light-emitting element 20 by photolithography wire or wire bonding. Since the corresponding surface 401 of the first electrode 400a and the second electrode 400b forms a concave 405, which is a metal surface for reflection, as the semiconductor light-emitting element 20 located on the concave 405 emits a light 15 (the dashed line) from a light-emitting side 206 of the semiconductor light-emitting element 20, the corresponding surface 401 can reflect the light 15 to improve overall light extraction efficiency. And, as shown in FIG. 1H, the groove 402 among the semiconductor light-emitting element 20, the first electrode 400a, and the second electrode 400 b can be filled in with insulating material 32 such as epoxy to enhance the ability of the structure of semiconductor light-emitting element 20 to resist thermal fatigue and protect the first connection point 201 and the second connection point 202.

Embodiment 2

Figure 2A:
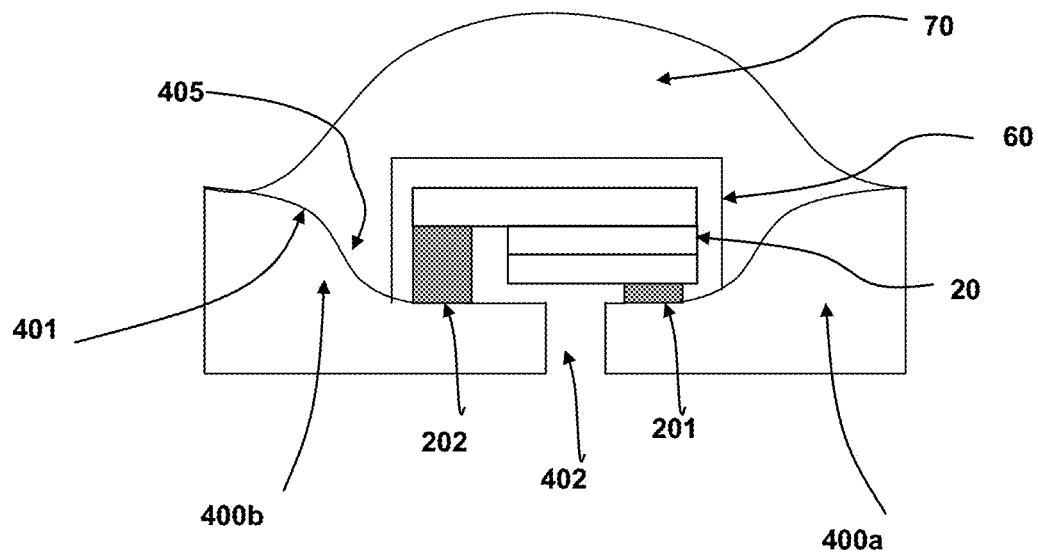
FIGS. 2A and 2B illustrate a structure of an LED in accordance with the second embodiment of the present application.
Figure 2B:
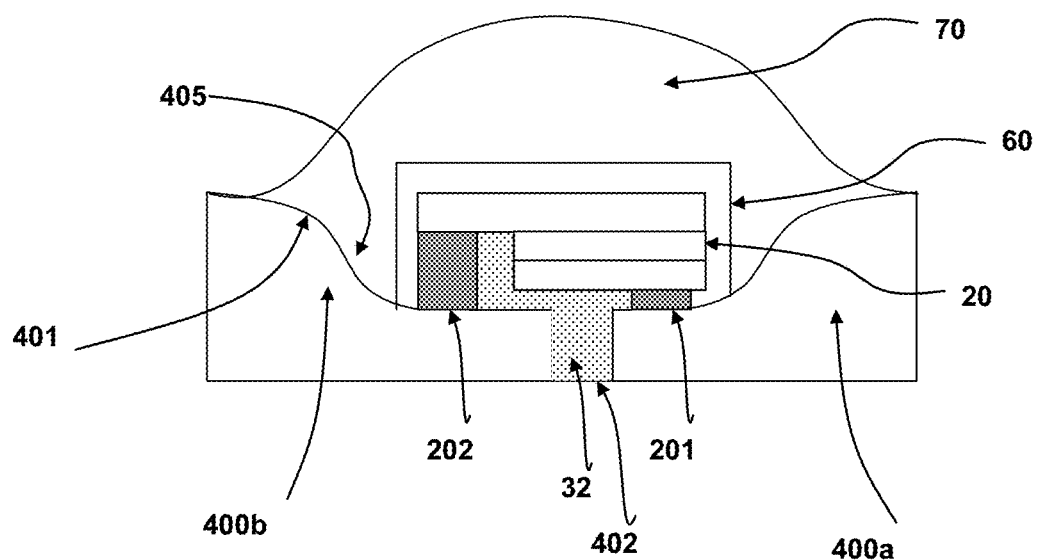

Next, as shown in FIG. 2A, the semiconductor light-emitting element 20 further can be covered by a wavelength conversion layer 60, wherein the wavelength conversion layer 60 can be formed by spin coating, deposition, dispensing, scraper, or molding glue filling. The wavelength conversion layer 60 includes at least one material which is blue phosphor, yellow phosphor, green phosphor, red phosphor, ZnSe, ZnCdSe, III-phosphide, III-arsenide, or the combination of III-nitride. The blue phosphor can convert the light to blue light, and the others like yellow phosphor, green phosphor, and red phosphor have the similar function. The material and the combination of any kinds of phosphor are conventional art and are not explained here. The wavelength conversion layer 60 converts all or partial of the light with a first wavelength emitted from the semiconductor light-emitting element 20 to a light with a second wavelength. After forming the wavelength conversion layer 60, an encapsulation layer 70 can also be formed on the light-emitting structure 50 by dispensing. The encapsulation layer 70 can be designed as a structure having a function of lens to improve light extraction efficiency. And, as shown in FIG. 2B, the groove 402 among the semiconductor light-emitting element 20, the first electrode 400a, and the second electrode 400 b can be filled in with insulating material 32 such as epoxy to enhance the ability of the structure of semiconductor light-emitting element 20 to resist thermal fatigue and protect the first connection point 201 and the second connection point 202.

Embodiment 3

Figure 3A:
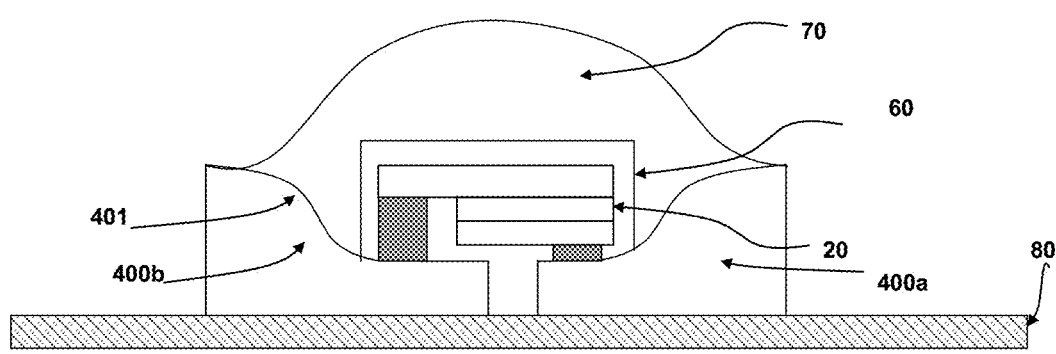
FIGS. 3A and 3B illustrate a structure of an LED in accordance with the third embodiment of the present application.
Figure 3B:
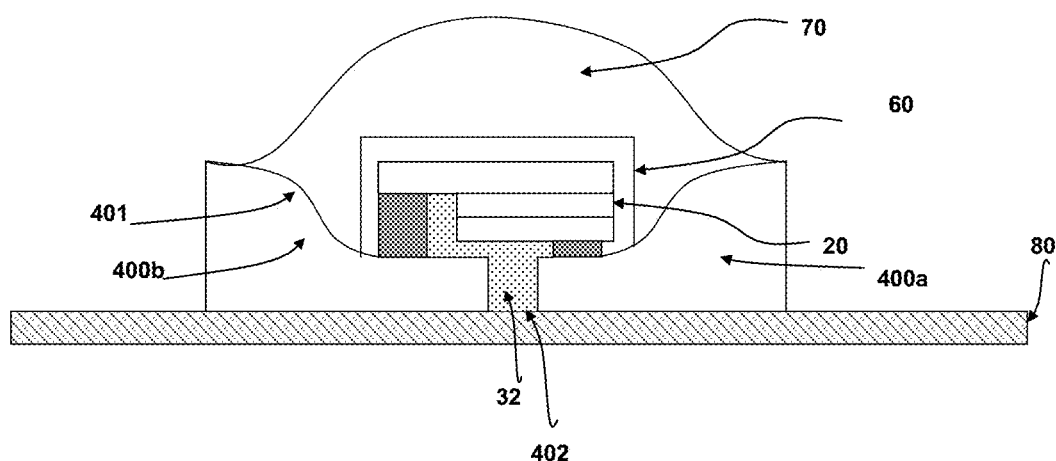

FIG. 3A shows another embodiment of the present application indicating the encapsulated light-emitting structure 50 disclosed in FIG. 2A is located upon a sub-carrier 80. The sub-carrier 80 can be a printed circuit board or a carrier with via plug. A control signal is transmitted into the light-emitting structure 50 via the sub-carrier 80 with the designed circuit. The light-emitting structure 50 can be welded on the sub-carrier 80 by the high-frequency welding process and so on. And, as shown in FIG. 3B, the groove 402 among the semiconductor light-emitting element 20, the first electrode 400a, and the second electrode 400 b can be filled in with an insulating material 32 such as epoxy to enhance the ability of the structure of semiconductor light-emitting element 20 to resist thermal fatigue and protect the first connection point 201 and the second connection point 202.

Embodiment 4

Figure 4A:
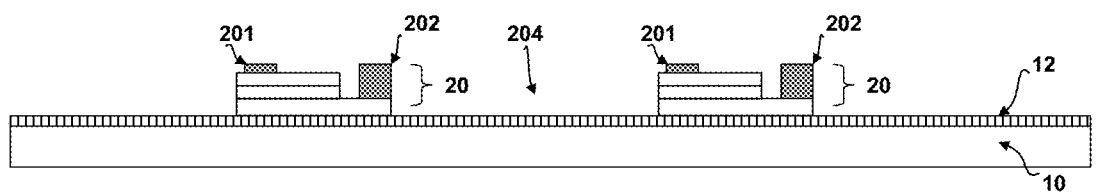
FIGS. 4A~4H illustrate a manufacturing process in accordance with the forth embodiment of the present application.

FIGS. 4A-4H are schematic diagrams in accordance with another embodiment of the present application. As shown in FIG. 4A, a carrier 10 is provided, and a connecting layer 12 is formed on the carrier 10 by spin coating, evaporation, or printing, wherein the upper and lower surfaces of the connecting layer 12 have adhesion to fix a plurality of semiconductor light-emitting elements 20 on the carrier 10. There is a plurality of gaps 204 between the semiconductor light-emitting elements 20. The plurality of the semiconductor light-emitting elements 20 can emit lights having the same or different wavelengths ranged from ultraviolet to infrared ray. The semiconductor light-emitting element 20 can be a light-emitting diode having a first connection point 201 and a second connection point 202 for the current injection for emitting light. The carrier 10 can be a temporary substrate, and the plural semiconductor light-emitting elements 20 can be produced elsewhere and then be transferred to the carrier 10. The material of the carrier 10 can be silicone rubber, glass, quartz, ceramic, or alloys.

Figure 4B:
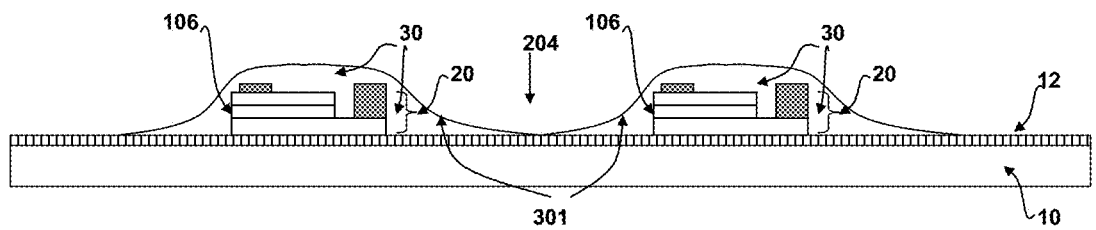

Then, as shown in FIG. 4B, a glue layer 30 is formed on the gap 204 wherein the glue layer 30 is mainly formed on the side wall 106 of the semiconductor light-emitting element 20 to form a surface 301. The glue layer 30 can be formed by spin coating, printing, or molding glue filling, and the material of the glue layer 30 can be elastic material such as silicone rubber, silicon resin, silicone gel, elastic PU, porous PU, acrylic rubber; or dies-cutting glue such as blue film and UV glue. During the process of forming the glue layer 30, part of the glue layer 30 may cover the first connection point 201 and the second connection point 202 of the semiconductor light-emitting element 20. In that case, the first connection point 201 and the second connection point 202 of the semiconductor light-emitting elements 20 can be exposed by polishing process to remove the glue layer 30 as shown in FIG. 4C.

Figure 4C:
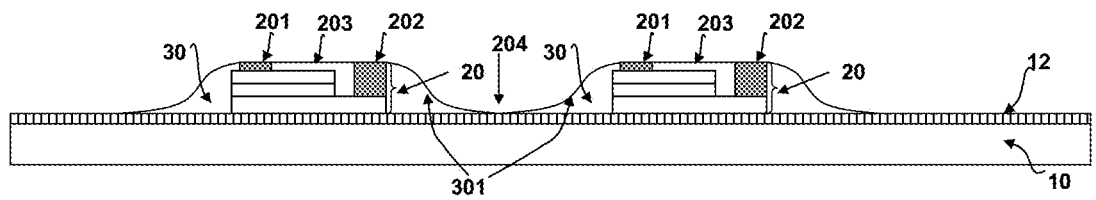
Figure 4D:
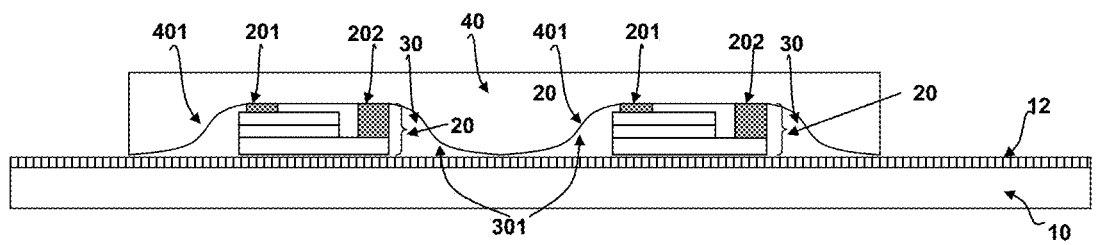

Next, as shown in FIG. 4D, a metal layer 40 is formed on the glue layer 30 and the semiconductor light-emitting elements 20. The metal layer 40 can be formed by plating, evaporation, or sputtering, and can be the material with conductivity and high reflectivity, such as copper (Cu), aluminum (Al), gold (Au), silver (Ag) or other alloys. Since the formation of the metal layer 40 follows the topography of the below structure, the metal layer 40 contacting with the glue layer 30 forms a corresponding surface 401 along the surface 301 of the glue layer 30, and contacts with the first connection point 201 and the second connection point 202 of the semiconductor light-emitting element 20, wherein the corresponding surface 401 can be a curved surface, a beveled surface, or the combination of a partial curved surface and a partial beveled surface.

Figure 4E:
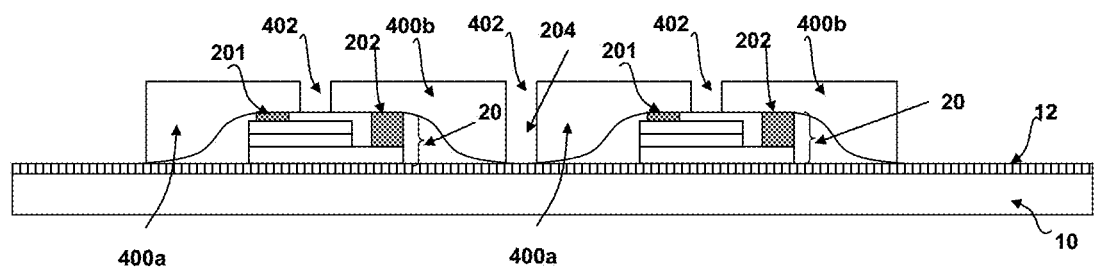

Then, as shown in FIG. 4E, the metal layer 40 can be patterned to form a plurality of grooves 402 by photolithography and etching, wherein the grooves 402 on the semiconductor light-emitting element 20 can divide the metal layer 40 on the semiconductor light-emitting elements 20 into a first electrode 400a and a second electrode 400b. The first electrode 400a is electrically connected to the first connection point 201, and the second electrode 400b is electrically connected to the second connection point 202. The groove 402 upon the gap 204 can electrically isolate the two adjacent semiconductor light-emitting elements 20.

In another embodiment, after the polishing process as shown in FIG. 4C, the first electrode 400a and the second electrode 400b can also be formed by the process of forming a patterned photoresist to cover the gap 204 and the second surface 203 between the first connection point 201 and the second connection point 202, and then electroplating metal material on the surface 301, the first connection point 201 and the second connection point 202, and then removing the patterned photoresist.

Figure 4F:
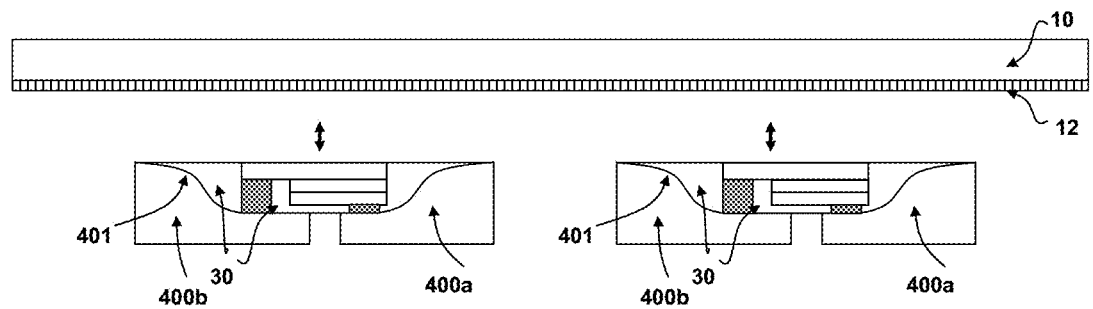
Figure 4G:
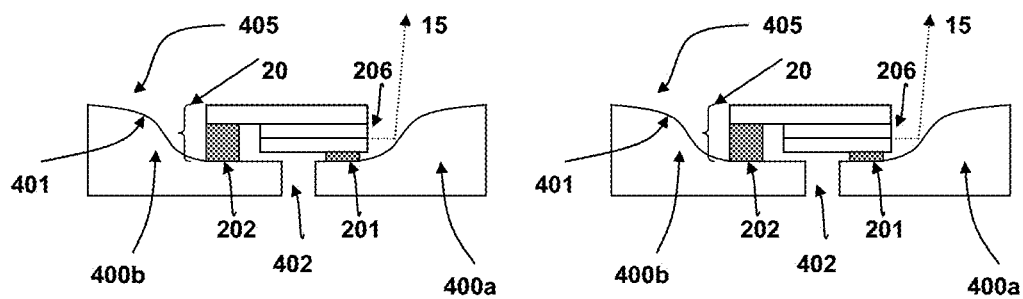
Figure 4H:
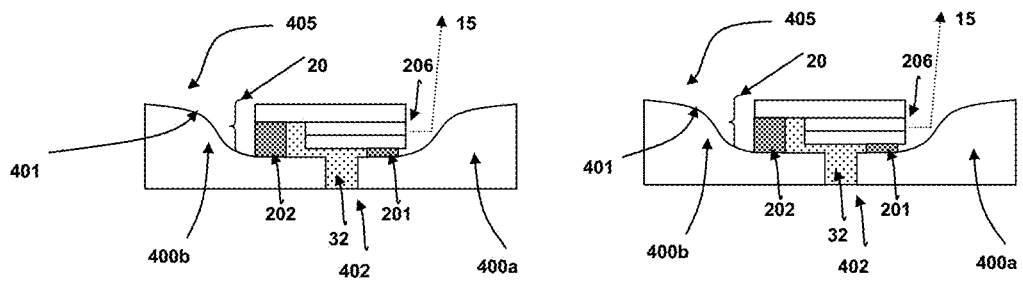

Then, as shown in FIG. 4F, the carrier 10 and the connecting layer 12 can be removed by laser lift-off, etching, or other methods. Finally, the glue layer 30 is removed as shown in FIG. 4G to exposes the corresponding surface 401 of the first electrode 400a and the second electrode 400b. A plurality of light-emitting structures 50 is formed accordingly. It should be noted that since the first electrode 400a and the second electrode 400b of the light-emitting structure 50 are conductive, the external current is injected into the semiconductor light-emitting element 20 through the first connection point 201 and the second connection point 202 to generate light. Therefore, there is no need to connect wires to the first connection point 201 and the second connection point 202 of the semiconductor light-emitting element 20 by photolithography wire and wire bonding. Since the corresponding surface 401 of the first electrode 400a and the second electrode 400b forms a concave 405, which is a metal surface for reflection, as the semiconductor light-emitting element 20 located on the concave 405 emits a light 15 (the dashed line) from a light-emitting side 206 of the semiconductor light-emitting element 20, the corresponding surface 401 can reflect the light 15 to improve overall light extraction efficiency. And, as shown in FIG. 4H, the groove 402 among the semiconductor light-emitting element 20, the first electrode 400a, and the second electrode 400 b can be filled in with an insulating material 32 such as epoxy to enhance the ability of the structure of semiconductor light-emitting element 20 to resist thermal fatigue and protect the first connection point 201 and the second connection point 202.

Embodiment 5

Figure 5A:
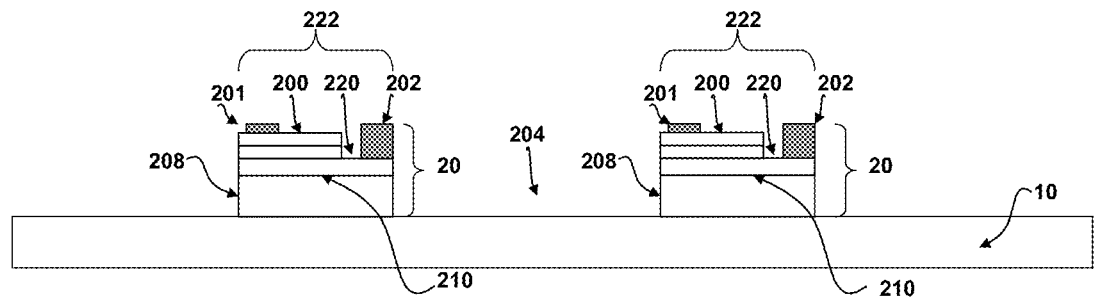
FIGS. 5A~5H illustrate a manufacturing process in accordance with the fifth embodiment of the present application.

FIGS. 5A~5H are schematic diagrams showing the structures in accordance with another embodiment of the present application. As shown in FIG. 5A, a carrier 10, on which several semiconductor light-emitting elements 20 are arranged, is provided. There is a gap 204 between the semiconductor light-emitting elements 20. The semiconductor light-emitting elements 20 can emit lights having the same or different wavelength(s) ranged between ultraviolet and infrared. The semiconductor light-emitting element 20 can be a light-emitting diode having an upper surface 200, on which a first connection point 201 is arranged, a down surface 220, on which a second connection point 202 is arranged, and a base 208. The upper surface and the down surface are on the same side 222 of the semiconductor light-emitting element 20. The material of the base can be transparent material such as Sapphire, Diamond, Glass, Epoxy, Quartz, Acryl, ZnO, or AN. The semiconductor light-emitting element 20 can emit light when the current is injected through the first and the second connection points. The carrier 10 can be a growth substrate, such as sapphire, SiC, ZnO, GaN, AlN, or GaAs, for growing the semiconductor light-emitting element 20. The semiconductor light-emitting elements 20 can be formed on the carrier 10 by a conventional semiconductor growth technology.

Figure 5B:
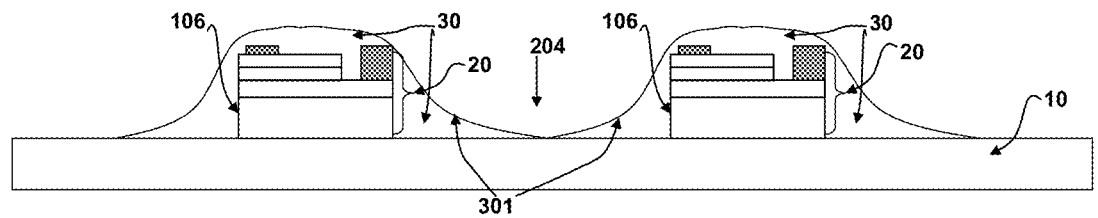
Figure 5C:
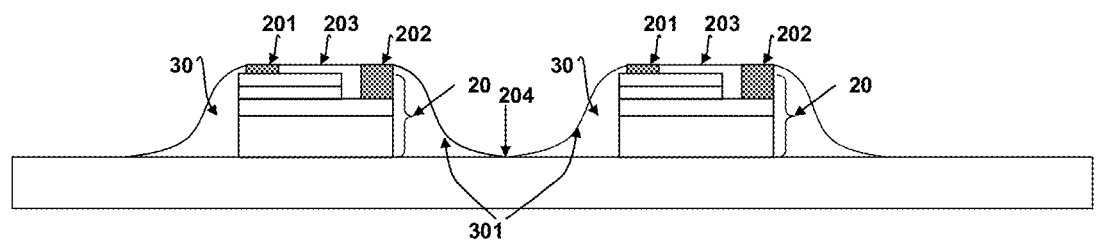

Then, as shown in FIG. 5B, a glue layer 30 is formed on the gap 204 wherein the glue layer 30 is mainly formed on the side wall 106 of the semiconductor light-emitting element 20 to form a surface 301. The glue layer 30 can be formed by spin coating, printing, or molding glue filling and the material of the glue layer 30 can be elastic material such as silicone rubber, silicon resin, silicone gel, elastic PU, porous PU, or acrylic rubber; or dies-cutting glue such as blue film and UV glue. During the process of forming the glue layer 30, some glue layer 30 may cover the first connection point 201 and the second connection point 202 of the semiconductor light-emitting element 20. In that case, the first connection point 201 and the second connection point 202 of the semiconductor light-emitting elements 20 can be exposed by polishing process to remove the glue layer 30 as shown in FIG. 5C.

Figure 5D:
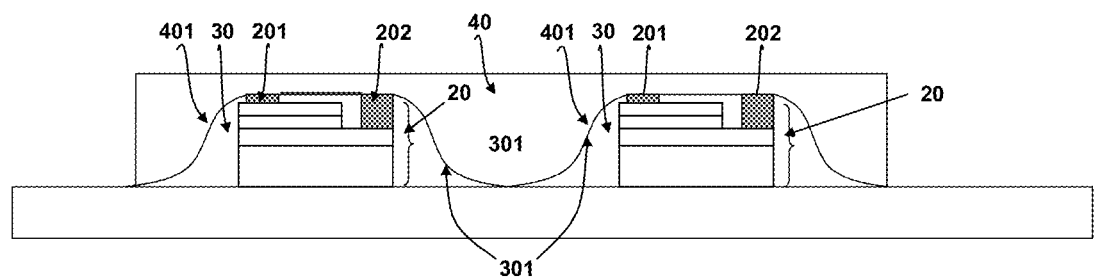

Next, as shown in FIG. 5D, a metal layer 40 is formed on the glue layer 30 and the semiconductor light-emitting elements 20. The metal layer 40 can be formed by plating, evaporation, or sputtering, and can be the material with conductivity and high reflectivity, such as copper (Cu), aluminum (Al), gold (Au), silver (Ag) or other alloys. Since the formation of the metal layer 40 follows the topography of the below structure, the metal layer 40 contacting with the glue layer 30 forms a corresponding surface 401 along the surface 301 of the glue layer 30, and contacts with the first connection point 201 and the second connection point 202 of the semiconductor light-emitting element 20, wherein the corresponding surface 401 can be a curved surface, a beveled surface, or the combination of a partial curved surface and a partial beveled surface.

Figure 5E:
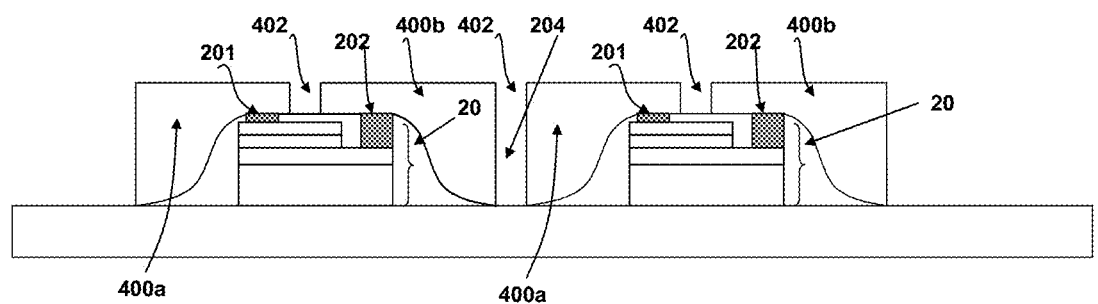

Then, as shown in FIG. 5E, the metal layer 40 can be patterned to form a plurality of grooves 402 by photolithography and etching, wherein the grooves 402 on the semiconductor light-emitting element 20 can divide the metal layer 40 on the semiconductor light-emitting elements 20 into the first electrodes 400a and the second electrodes 400b. The first electrode 400a is electrically connected to the first connection point 201, and the second electrode 400b is electrically connected to the second connection point 202.

The groove 402 upon the gap 204 can electrically isolate the two adjacent semiconductor light-emitting elements 20.

In another embodiment, after the polishing process as shown in FIG. 5C, the first electrode 400a and the second electrode 400b can also be formed by the process of forming a patterned photoresist to cover the gap 204 and the second surface 203 between the first connection point 201 and the second connection point 202, and then electroplating metal material on the surface 301, the first connection point 201 and the second connection point 202, and then removing the patterned photoresist.

Figure 5F:
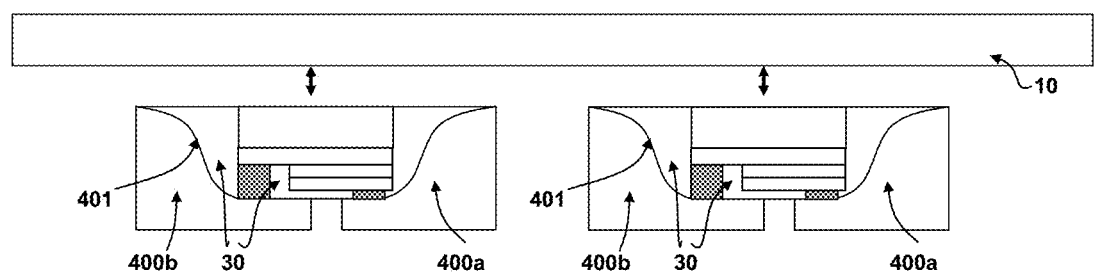
Figure 5G:
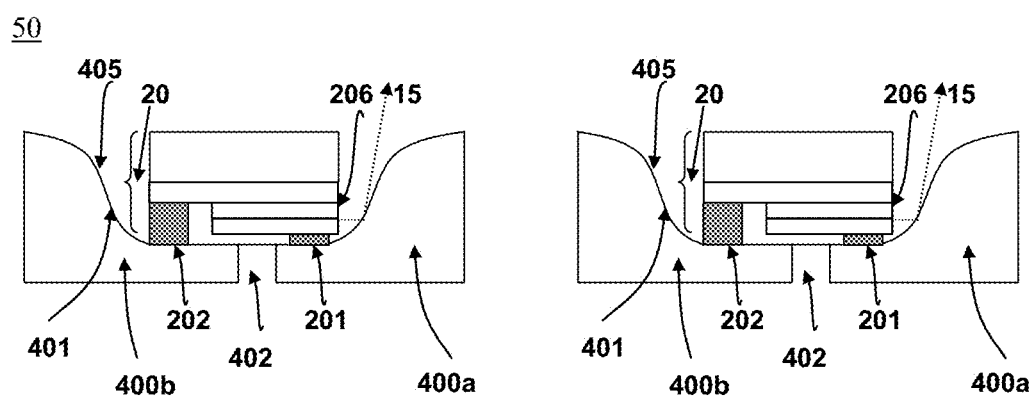
Figure 5H:
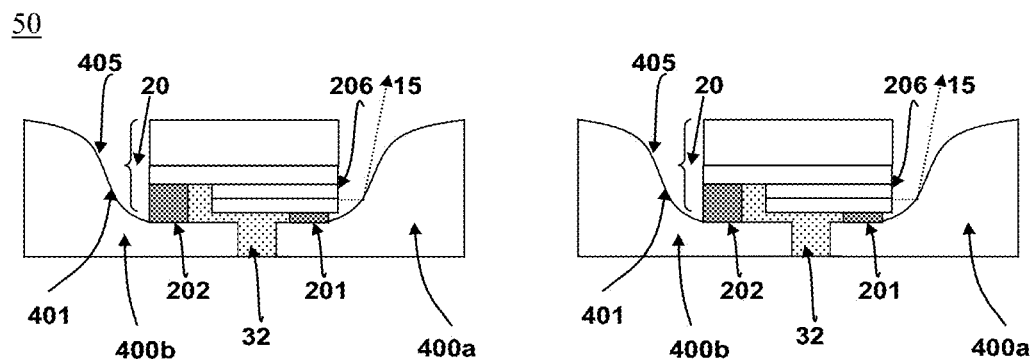

Then, as shown in FIG. 5F, the carrier 10 can be removed by laser lift-off, etching, or other methods. Finally, the glue layer 30 is removed as shown in FIG. 5G to exposes the corresponding surfaces 401 of the first electrode 400a and the second electrode 400b. A plurality of light-emitting structures 50 is formed accordingly. It should be noted that since the first electrode 400a and the second electrode 400b of the light-emitting structure 50 are conductive, the external current is injected into the semiconductor light-emitting element 20 through the first connection point 201 and the second connection point 202 to generate light. Therefore, there is no need to connect wires to the first connection point 201 and the second connection point 202 of the semiconductor light-emitting element 20 by photolithography wire or wire bonding. Since the corresponding surface 401 of the first electrode 400a and the second electrode 400b forms a concave 405 which is a metal surface for reflection, as the semiconductor light-emitting element 20 located on the concave 405 emits a light 15 (the dashed line) from a light-emitting side 206 of the semiconductor light-emitting element 20, the corresponding surface 401 can reflect the light 15 to improve overall light extraction efficiency. And, as shown in FIG. 5H, the groove 402 among the semiconductor light-emitting element 20, the first electrode 400a, and the second electrode 400 b can be filled in with an insulating material 32 such as epoxy to enhance the ability of the structure of semiconductor light-emitting element 20 to resist thermal fatigue and protect the first connection point 201 and the second connection point 202.

Embodiment 6

Figure 6A:
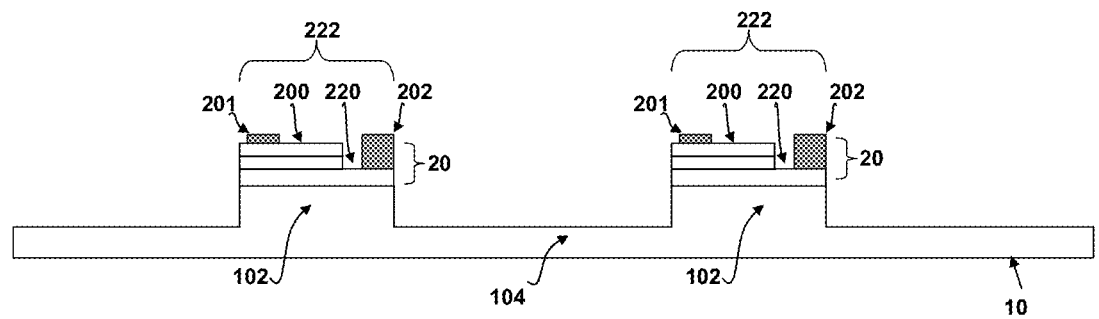
FIGS. 6A~6H illustrate a manufacturing process in accordance with the sixth embodiment of the present application.

FIGS. 6A~6H are schematic diagrams showing the structures in accordance with the sixth embodiment of the present application. As shown in FIG. 6A, a carrier 10 which has a plurality of convex portions 102 and a plurality of channel portions 104 is provided. Several semiconductor light emitting elements 20 are arranged on the convex portions 102 correspondingly. The semiconductor light-emitting elements 20 can emit lights having the same or different wavelength(s) ranged between ultraviolet and infrared. The semiconductor light-emitting element 20 can be a light-emitting diode having an upper surface 200, on which a first connection point 201 is arranged, and a down surface 220, on which a second connection point 202 is arranged, wherein the upper surface and the down surface are on the same side 222 of the light-emitting element 20. The semiconductor light-emitting element 20 can emit light when the current is injected through the first and the second connection points. The carrier 10 can be a growth substrate, such as sapphire, SiC, ZnO, GaN, AlN, or GaAs, for growing the semiconductor light-emitting element 20. The semiconductor light-emitting elements 20 can be formed on the carrier 10 by a conventional semiconductor growth technology.

Figure 6B:
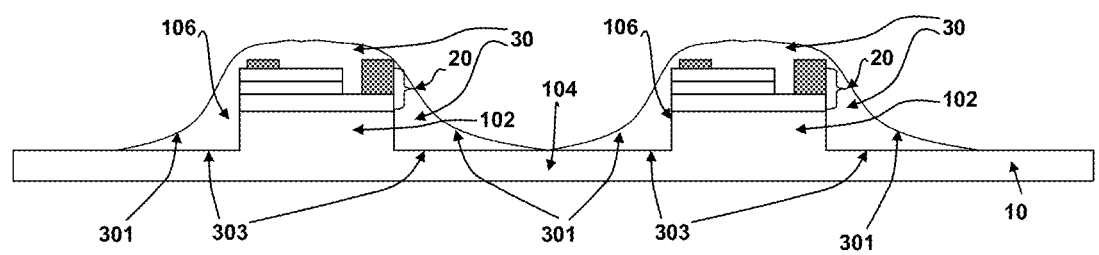

Then, as shown in FIG. 6B, a glue layer 30 is formed on the channel portions 104 wherein the glue layer 30 is mainly formed on the side wall 106 of the semiconductor light-emitting element 20 to form a surface 301. The glue layer 30 can be formed by spin coating, printing, or molding glue filling and the material of the glue layer 30 can be elastic material such as silicone rubber, silicon resin, silicone gel, elastic PU, porous PU, or acrylic rubber; or dies-cutting glue such as blue film and UV glue. During the process of forming the glue layer 30, some glue layer 30 may cover the first connection point 201 and the second connection point 202 of the semiconductor light-emitting element 20. In that case, the first connection point 201 and the second connection point 202 of the semiconductor light-emitting elements 20 can be exposed by polishing process to remove the glue layer 30 as shown in FIG. 6C.

Figure 6C:
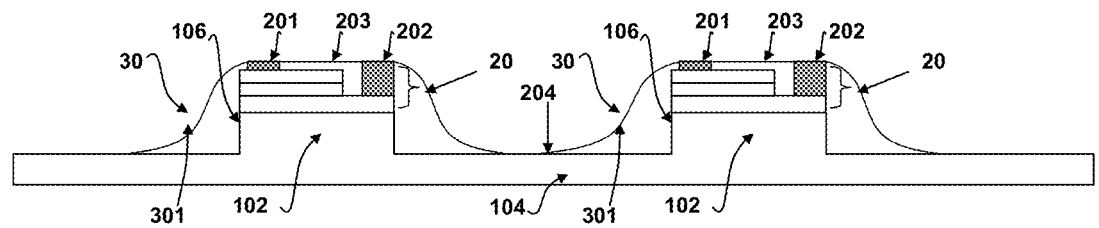
Figure 6D:
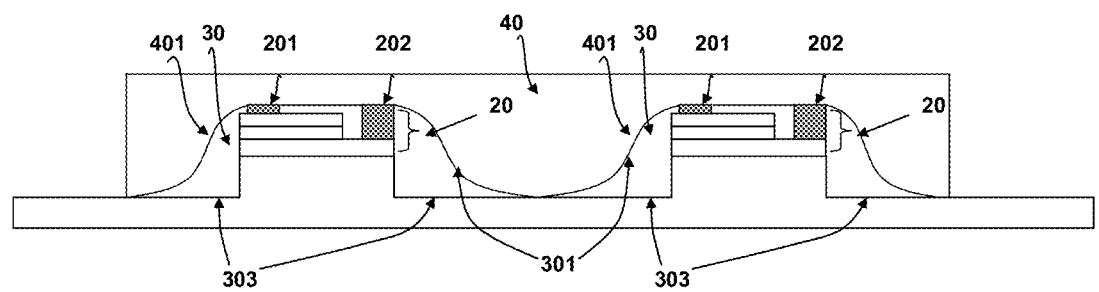

Next, as shown in FIG. 6D, a metal layer 40 is formed on the glue layer 30 and the semiconductor light-emitting elements 20. The metal layer 40 can be formed by plating, evaporation, or sputtering, and can be the material with conductivity and high reflectivity, such as copper (Cu), aluminum (Al), gold (Au), silver (Ag) or other alloys. Since the formation of the metal layer 40 follows the topography of the below structure, the metal layer 40 contacting with the glue layer 30 forms a corresponding surface 401 along the surface 301 of the glue layer 30, and contacts with the first connection point 201 and the second connection point 202 of the semiconductor light-emitting element 20, wherein the corresponding surface 401 can be a curved surface, a beveled surface, or the combination of a partial curved surface and a partial beveled surface.

Figure 6E:
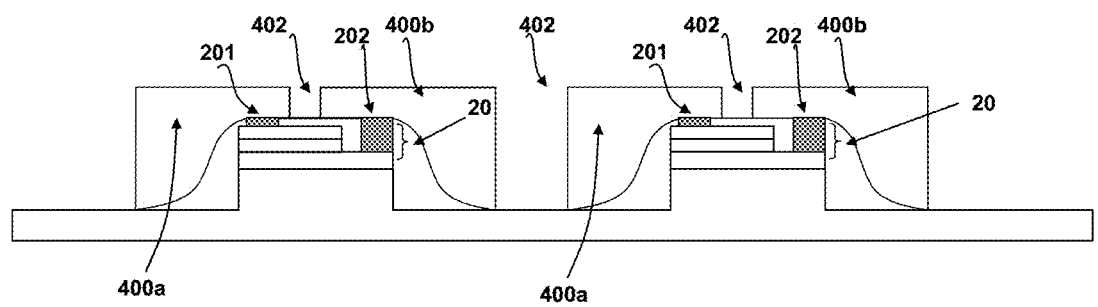

Then, as shown in FIG. 6E, the metal layer 40 can be patterned to form a plurality of grooves 402 by photolithography and etching, wherein the grooves 402 on the semiconductor light-emitting element 20 can divide the metal layer 40 on the semiconductor light-emitting elements 20 into the first electrodes 400a and the second electrodes 400b. The first electrode 400a is electrically connected to the first connection point 201, and the second electrode 400b is electrically connected to the second connection point 202. The groove 402 upon the gap 204 can electrically isolate the two adjacent semiconductor light-emitting elements 20.

In another embodiment, after the polishing process as shown in FIG. 6C, the first electrode 400a and the second electrode 400b can also be formed by the process of forming a patterned photoresist to cover the gap 204 and the second surface 203 between the first connection point 201 and the second connection point 202, and then electroplating metal material on the surface 301, the first connection point 201 and the second connection point 202, and then removing the patterned photoresist.

Figure 6F:
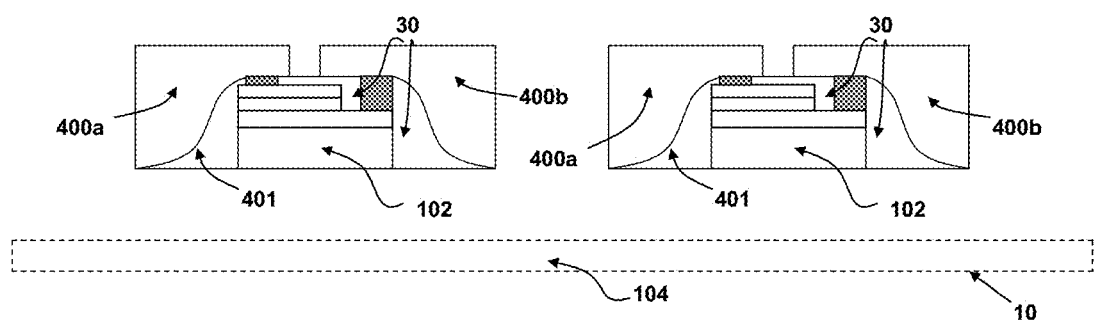
Figure 6G:
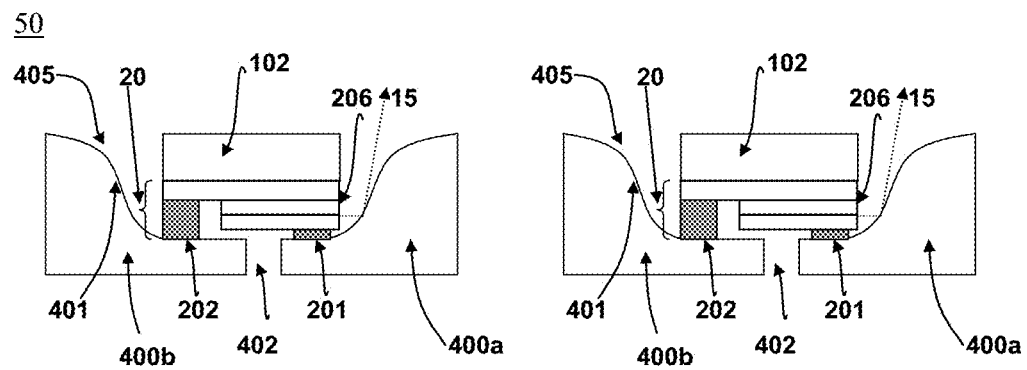
Figure 6H:
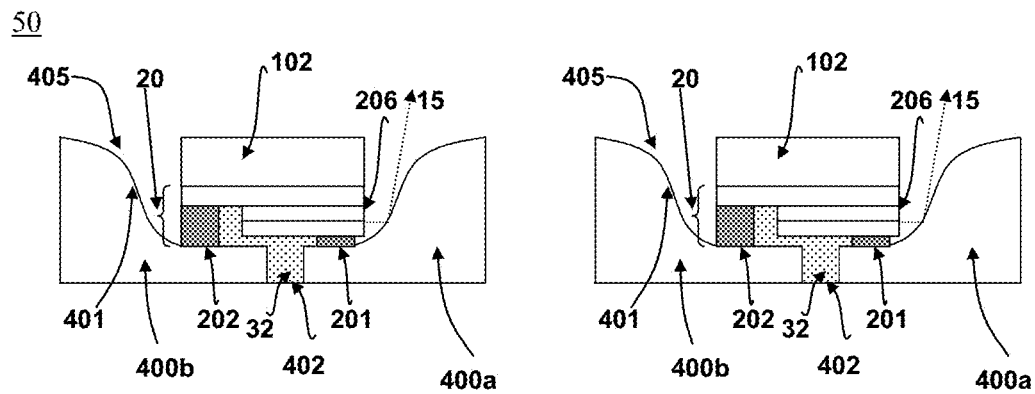

Then, as shown in FIG. 6F, the channel portions 104 of the carrier 10 can be removed by etching or polishing process. Finally, the glue layer 30 is removed as shown in FIG. 6G to exposes the corresponding surfaces 401 of the first electrode 400a and the second electrode 400b. A plurality of light-emitting structures 50 is formed accordingly. It should be noted that since the first electrode 400a and the second electrode 400b of the light-emitting structure 50 are conductive, the external current is injected into the semiconductor light-emitting element 20 through the first connection point 201 and the second connection point 202 to generate light. Therefore, there is no need to connect wires to the first connection point 201 and the second connection point 202 of the semiconductor light-emitting element 20 by photolithography for connector or wire bonding. Since the corresponding surface 401 of the first electrode 400a and the second electrode 400b forms a concave 405, which is a metal surface for reflection, as the semiconductor light-emitting element 20 located on the concave 405 emits a light 15 (the dashed line) from a light-emitting side 206 of the semiconductor light-emitting element 20, the corresponding surface 401 can reflect the light 15 to improve overall light extraction efficiency. And, as shown in FIG. 6H, the groove 402 among the semiconductor light-emitting element 20, the first electrode 400a, and the second electrode 400b can be filled in with insulating material 32 such as epoxy to enhance the ability of the structure of semiconductor light-emitting element 20 to resist thermal fatigue and protect the first connection point 201 and the second connection point 202.

Embodiment 7

Figure 7:
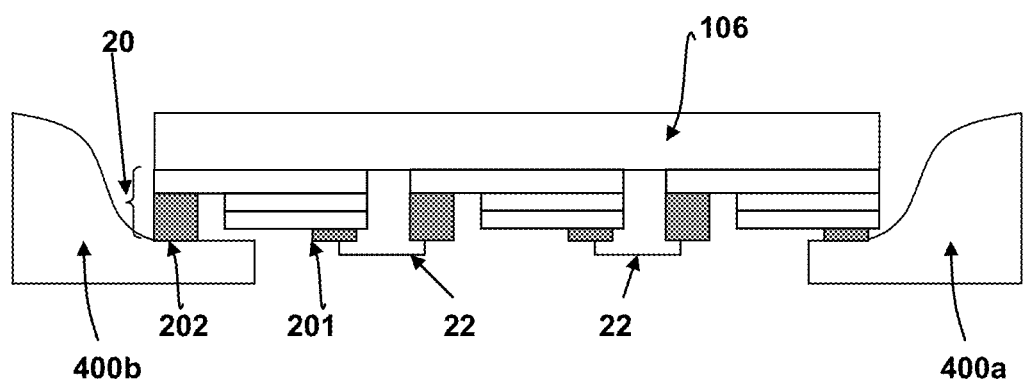
FIG. 7 illustrates a structure in accordance with the seventh embodiment of the present application.

Next, as shown in FIG. 7, the semiconductor light-emitting elements 20 further can be connected to form a series connection. The series connection is formed by connecting wires to the first connection point 201 and the second connection point 202 with photolithography wire bonding or wire bonding.

By means of the detail descriptions of what is presently considered to be the most practical and preferred embodiments of the subject invention, it is the expectation that the features and the gist thereof are plainly revealed. Nevertheless, these above-mentioned illustrations are not intended to be construed in a limiting sense. Instead, it should be well understood that any analogous variation and equivalent arrangement is supposed to be covered within the spirit and scope to be protected and that the interpretation of the scope of the subject invention would therefore as much broadly as it could apply.

What is claimed is:

1. A light-emitting structure, comprising:
    a semiconductor light-emitting element comprising a bottom surface, a top surface opposite to the bottom surface, and a side surface arranged between the bottom surface and the top surface;
    a first connection point arranged under the bottom surface; and
    a reflective element, comprising an inner sidewall having a first portion arranged right beneath the bottom surface, and a second portion not overlapping the bottom surface and uplifted from a lower elevation lower than the bottom surface to a higher elevation substantially equal to that of the top surface along a curved path,
    wherein the curved path has a first slope variation from a first smaller value to a first greater value, and a second slope variation from a second greater value to a second smaller value.

2. The light-emitting structure of claim 1, wherein the first connection point contacts the reflective element.

3. The light-emitting structure of claim 1, wherein the reflective element further comprises an outer surface substantially parallel to the side surface and connected to the second portion.

4. The light-emitting structure of claim 1, wherein the bottom surface has a portion not covered by the reflective element.

5. The light-emitting structure of claim 1, further comprising a wavelength conversion layer formed on the top surface.

6. The light-emitting structure of claim 5, wherein the wavelength conversion layer comprises a topmost surface higher than the second portion.

7. The light-emitting structure of claim 5, wherein the wavelength conversion layer directly contacts the top surface.

8. The light-emitting structure of claim 5, wherein the wavelength conversion layer is extended beyond the side surface.

9. The light-emitting structure of claim 1, wherein the reflective element has an uppermost surface, a lowermost surface opposite to the uppermost surface, and a space between the uppermost surface and the lowermost surface which is fully occupied by a single material.

10. The light-emitting structure of claim 1, further comprising a second connection point arranged under the bottom surface.

11. The light-emitting structure of claim 10, wherein the reflective element has a part arranged between the first connection point and the second connection point.

12. A light-emitting structure, comprising:
    a semiconductor light-emitting element comprising a bottom surface, a top surface opposite to the bottom surface, and a side surface arranged between the bottom surface and the top surface;
    a first connection point and a second connection point arranged under the bottom surface; and
    a reflective element, comprising a part arranged between the first connection point and the second connection point and an inner sidewall having a first portion arranged right beneath the bottom surface, and a second portion not overlapping the bottom surface and uplifted from a lower elevation lower than the bottom surface to a higher elevation substantially equal to that of the top surface along a curved path,
    wherein the semiconductor light-emitting element is separated from the second portion by a distance which is gradually increased along a direction normal to the side surface, and
    wherein the curved path has a first slope variation from a first smaller value to a first greater value, and a second slope variation from a second greater value to a second smaller value.

13. The light-emitting structure of claim 12, wherein the second portion comprises a curved surface, a beveled surface, or a combination thereof.

14. The light-emitting structure of claim 12, further comprising a wavelength conversion layer formed on the top surface.

15. The light-emitting structure of claim 14, wherein the wavelength conversion layer comprises a topmost surface higher than the second portion.

16. The light-emitting structure of claim 14, wherein the wavelength conversion layer directly contacts the top surface.

17. The light-emitting structure of claim 14, wherein the wavelength conversion layer is extended beyond the side surface.

18. The light-emitting structure of claim 12, wherein the reflective element has an uppermost surface, a lowermost surface opposite to the uppermost surface and a space between the uppermost surface and the lowermost surface which is fully occupied by a single material.

* * * * *